United States Patent
Hashimoto et al.

(10) Patent No.: US 11,930,711 B2
(45) Date of Patent: Mar. 12, 2024

(54) VIBRATION STRUCTURE AND VIBRATION GENERATOR

(71) Applicant: Murata Manufacturing Co., Ltd., Nagaokakyo (JP)

(72) Inventors: Junichi Hashimoto, Nagaokakyo (JP); Jun Endo, Nagaokakyo (JP); Toru Tominaga, Nagaokakyo (JP); Shozo Otera, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 720 days.

(21) Appl. No.: 16/923,345

(22) Filed: Jul. 8, 2020

(65) Prior Publication Data

US 2020/0343439 A1 Oct. 29, 2020

Related U.S. Application Data

(63) Continuation of application No. PCT/JP2019/045267, filed on Nov. 19, 2019.

(30) Foreign Application Priority Data

Dec. 27, 2018 (JP) .................. 2018-245657

(51) Int. Cl.
*H01L 41/053* (2006.01)
*H10N 30/20* (2023.01)
(Continued)

(52) U.S. Cl.
CPC ......... *H10N 30/206* (2023.02); *H10N 30/857* (2023.02); *H10N 30/88* (2023.02)

(58) Field of Classification Search
CPC .......................... H01L 41/0986; H01L 41/053
(Continued)

(56) References Cited

U.S. PATENT DOCUMENTS

2009/0284872 A1* 11/2009 Hida .................... G11B 5/4826
2011/0074247 A1    3/2011 Hohlfeld et al.
(Continued)

FOREIGN PATENT DOCUMENTS

JP    H03124645 A    5/1991
JP    2001179180 A   7/2001
(Continued)

OTHER PUBLICATIONS

International Search Report issued for PCT/JP2019/045267, dated Feb. 4, 2020.
(Continued)

*Primary Examiner* — Derek J Rosenau
(74) *Attorney, Agent, or Firm* — ArentFox Schiff LLP

(57) ABSTRACT

A vibration structure that includes a piezoelectric film constructed to deform in a plane direction as a voltage is applied thereto, a frame-shaped member, a vibration portion surrounded by the frame-shaped member in a plan view of the vibration structure, a support portion connecting the vibration portion and the frame-shaped member, and supporting the vibration portion within the frame-shaped member such that the vibration portion vibrates in the plane direction when the piezoelectric film is deformed in the plane direction, a first connection member that connects the piezoelectric film to the vibration portion, and a second connection member that connects the piezoelectric film to the frame-shaped member. Of the connection members, the first connection member is disposed between the center of gravity of the vibration portion and the second connection member.

20 Claims, 4 Drawing Sheets

(51) Int. Cl.
*H10N 30/857* (2023.01)
*H10N 30/88* (2023.01)

(58) Field of Classification Search
USPC .......................................... 310/328
See application file for complete search history.

(56) References Cited

U.S. PATENT DOCUMENTS

2017/0040525 A1\* 2/2017 Ikeda ...................... H01L 41/09
2019/0155391 A1   5/2019 Hashimoto et al.

FOREIGN PATENT DOCUMENTS

| JP | 200425009 A | 1/2004 |
| JP | 2009142045 A | 6/2009 |
| JP | 201671451 A | 5/2016 |
| WO | 2014141336 A1 | 9/2014 |
| WO | 2019013164 A1 | 1/2019 |

OTHER PUBLICATIONS

Written Opinion of the International Searching Authority issued for PCT/JP2019/045267, dated Feb. 4, 2020.

\* cited by examiner

VIBRATION STRUCTURE AND VIBRATION GENERATOR

CROSS REFERENCE TO RELATED APPLICATIONS

The present application is a continuation of International application No. PCT/JP2019/045267, filed Nov. 19, 2019, which claims priority to Japanese Patent Application No. 2018-245657, filed Dec. 27, 2018, the entire contents of each of which are incorporated herein by reference.

FIELD OF THE INVENTION

The present invention relates to a vibration structure and a vibration generator that generate vibration.

BACKGROUND OF THE INVENTION

In recent years, a vibration generator that generates vibration using an electrostrictive body such as a piezoelectric element has been proposed.

For example, Japanese Patent Application Laid-Open No. 2004-25009 (Patent Document 1) discloses a seesaw-type vibration generator that generates vibration by swinging a seesaw plate using two piezoelectric elements.

Patent Document 1: Japanese Patent Application Laid-Open No. 2004-25009

SUMMARY OF THE INVENTION

However, in a case of a structure that generates vibration accompanied by a rotational motion such as swinging or vibration in a direction perpendicular to a vibration surface, a noise sound such as a vibration sound is likely to be generated.

In view of the above, an object of the present invention is to provide a vibration structure and a vibration generator that suppress generation of a vibration sound.

A vibration structure according to a first aspect of the present disclosure includes a film constructed to deform in a plane direction as a voltage is applied thereto, a frame-shaped member, a vibration portion surrounded by the frame-shaped member in a plan view of the vibration structure, a support portion connecting the vibration portion and the frame-shaped member, and supporting the vibration portion within the frame-shaped member such that the vibration portion vibrates in the plane direction when the film is deformed in the plane direction, a first connection member that connects the film to the vibration portion, and a second connection member that connects the film to the frame-shaped member. The first connection member is provided between the center of gravity of the vibration portion and the second connection member when the vibration portion is viewed in the plan view.

A vibration structure according to a second aspect of the present disclosure includes a film constructed to deform in a plane direction as a voltage is applied thereto, a frame-shaped member, a vibration portion surrounded by the frame-shaped member in a plan view of the vibration structure, a support portion connecting the vibration portion and the frame-shaped member, and supporting the vibration portion within the frame-shaped member such that the vibration portion vibrates in the plane direction when the film is deformed in the plane direction, a first connection member that connects the film to the vibration portion, and a second connection member that connects the film to the frame-shaped member.

A vibration generator of the present disclosure includes the vibration structure according to the first or second aspect of the present disclosure, a housing in which the vibration structure is disposed, and a spacer member that provides a space between the vibration structure and the housing.

By using the vibration structure and the vibration generator, generation of a vibration sound can be suppressed.

DETAILED DESCRIPTION OF THE INVENTION

Figure 1A:
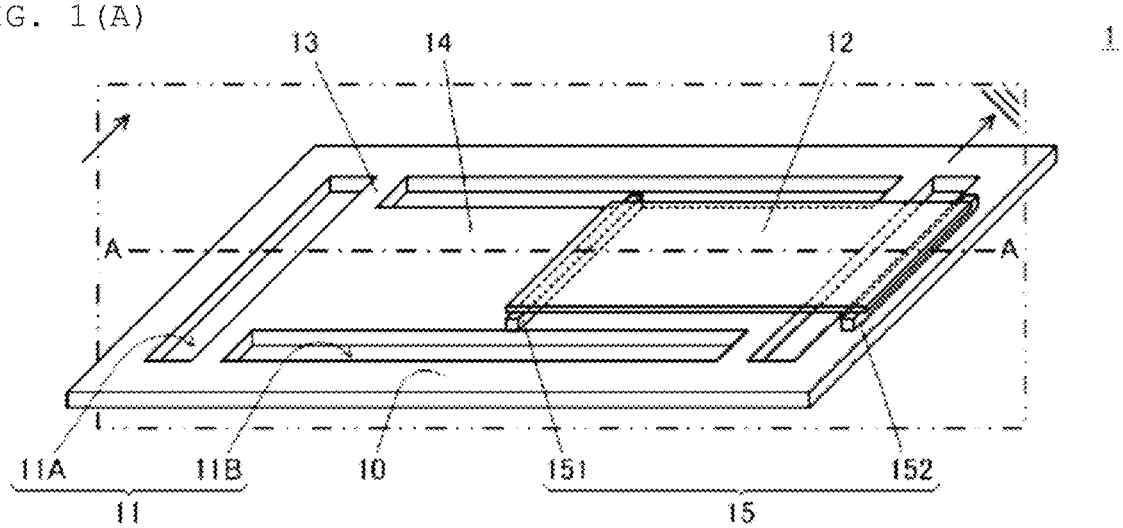
FIG. 1(A) is a perspective view of a vibration structure 1.
Figure 1B:
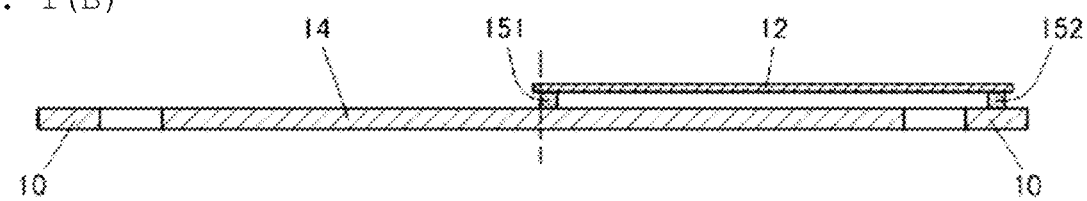
FIG. 1(B) is a cross-sectional view along A-A in FIG. 1(A).

FIG. 1(A) is a perspective view of a vibration structure 1 according to a first embodiment of the present invention. FIG. 1(B) is a cross-sectional view of the vibration structure 1 along A-A in FIG. 1(A).

The vibration structure 1 of the present embodiment includes a frame-shaped member 10, a piezoelectric film 12, a support portion 13, a vibration portion 14, and a connection member 15 having a first connection member 151 and a second connection member 152.

The frame-shaped member 10 has a rectangular shape in a plan view, and has an inner region surrounded by the frame-shaped member 10. In the region surrounded by the frame-shaped member 10, the support portion 13 and the vibration portion 14 are disposed. The region surrounded by the frame-shaped member 10 has two first openings 11A disposed at both ends in a longitudinal direction of the frame-shaped member 10, and two second openings 11B disposed at both ends in a short direction, which are formed by the support portion 13 and the vibration portion 14. The first opening 11A has a rectangular shape, and has a shape that is long along the short direction of the frame-shaped member 10. The second opening 11B is rectangular, and has a long shape along the longitudinal direction of the frame-shaped member 10. Both ends in the longitudinal direction of the second opening 11B extend toward a center axis (line A-A in the diagram) of the frame-shaped member 10.

The vibration portion 14 has a rectangular shape in the plan view, and is disposed in a region surrounded by the frame-shaped member 10. An area of the vibration portion 14 is smaller than an area of the region surrounded by the frame-shaped member 10.

The support portion 13 connects the vibration portion 14 and the frame-shaped member 10 so that the vibration portion 14 is supported by the frame-shaped member 10. In this example, the support portion 13 has a rectangular shape that is long along the short direction of the frame-shaped member 10 that is a direction orthogonal to the direction in which the piezoelectric film 12 expands and contracts, and holds the vibration portion 14 at both end portions in the longitudinal direction of the vibration portion 14.

In this example, the frame-shaped member 10, the vibration portion 14, and the support portion 13 are formed of the same material (for example, acrylic resin, PET, polycarbonate (PC), glass epoxy, FRP, metal, glass, or the like). That is, the frame-shaped member 10, the vibration portion 14, and the support portion 13 are formed by punching a single rectangular plate member along shapes of the first opening 11A and the second opening 11B. The frame-shaped member 10, the vibration portion 14, and the support portion 13 may be different materials, but can be easily manufactured by being formed of the same material. Alternatively, as the frame-shaped member 10, the vibration portion 14, and the support portion 13 are formed of the same material, another material (a member with creep deterioration) such as rubber does not need to be used for supporting the vibration portion 14, and the vibration portion 14 can be stably held for a long time. Further, in a case where they are formed of the same material and punching is performed, the natural vibration periods of a plurality of the support portions 13 are exactly the same, so that the vibration variation of the vibration portion 14 when the vibration portion 14 is vibrated can be reduced. However, in the present invention, these members do not need to be formed of the same material. For example, in a case where different materials are used for a plurality of the support portions 13, the movement of the vibration portion 14 can be adjusted. For example, when a material having a high elastic coefficient such as rubber is used for the support portion 13, the magnitude of voltage applied to the piezoelectric film 12 can be reduced.

The piezoelectric film 12 is connected to the frame-shaped member 10 and the vibration portion 14. The piezoelectric film 12 is a film that deforms in a plane direction when voltage is applied. The piezoelectric film 12 has a rectangular shape that is long along the longitudinal direction of the frame-shaped member 10 in the plan view. The piezoelectric film 12 is made from, for example, polyvinylidene fluoride (PVDF). Alternatively, the piezoelectric film 12 may be in a mode of being made from a chiral polymer. As the chiral polymer, for example, L-type polylactic acid (PLLA) or D-type polylactic acid (PDLA) is used.

When PVDF is used for the piezoelectric film 12, since the PVDF has water resistance, an electronic device including the vibration member in this example can be vibrated similarly under any humidity environment.

Further, in a case where PLLA is used for the piezoelectric film 12, since PLLA is a highly transmissive material, if an electrode added to PLLA and the vibration portion 14 are made from a transparent material, an internal situation of the equipment can be visually recognized. Accordingly, the equipment can be easily manufactured. Further, since PLLA has no pyroelectricity, similar vibration can be caused under any temperature environment.

In a case where the piezoelectric film 12 is configured with PLLA, the piezoelectric film 12 has piezoelectricity by being cut so that each outer peripheral side is approximately 45° with respect to a stretching direction.

A first end in the longitudinal direction of the piezoelectric film 12 is connected to a first end in the longitudinal direction of the frame-shaped member 10. A second end of the piezoelectric film 12 is connected closer to the first end side than the center of gravity of the vibration portion 14.

As the piezoelectric film 12 is connected closer to the first end side than the center of gravity of the vibration portion 14, rotation around the center of gravity can be suppressed when the vibration portion 14 vibrates.

The piezoelectric film 12 is connected to the frame-shaped member 10 and the vibration portion 14 via the connection member 15. The connection member 15 having a rectangular shape that is long along a short side direction of the frame-shaped member 10 in the plan view has certain thickness, and connects the piezoelectric film 12 and the vibration portion 14 at positions separated from each other to some extent, so that the piezoelectric film 12 does not contact the vibration portion 14. In this manner, an electrode (not shown) provided on both main surfaces of the piezoelectric film 12 does not contact the vibration portion 14, so that even if the piezoelectric film 12 expands and contracts and the vibration portion 14 vibrates, the electrode is not scraped. Note that, in a case where the frame-shaped member 10, the support portion 13, and the vibration portion 14 are conductive members, an insulating member or a coating film is preferably disposed between the connection member 15 and the frame-shaped member 10, the support portion 13, and the vibration portion 14. In this case, an electrical short circuit can be prevented between the frame-shaped member 10, the support portion 13, and the vibration portion 14 and the electrode of the piezoelectric film 12.

The connection member 15 is made from, for example, metal, PET, polycarbonate (PC), polyimide, or ABS resin. The connection member 15 includes the first connection member 151 for connecting the piezoelectric film 12 and the vibration portion 14 with an adhesive or the like, and the second connection member 152 for connecting the piezoelectric film 12 and the frame-shaped member 10 with an adhesive or the like. Note that connecting the connection member 15 to various components by an adhesive or the like is not essential. For example, the connection member 15 itself may be an adhesive or a double-sided tape. In this case, an adhesive or the like does not need to be prepared separately.

The piezoelectric film 12 is connected to the frame-shaped member 10 and the vibration portion 14 via the connection member 15 interposed therebetween in a state where a certain amount of tension is applied. However, that the piezoelectric film 12 is connected while being applied with tension is not essential. The piezoelectric film 12 may be connected so that tension is applied when contracted.

The piezoelectric film 12 is deformed in the plane direction when voltage is applied. Specifically, the piezoelectric film 12 expands and contracts in the longitudinal direction when voltage is applied. As the piezoelectric film 12 expands and contracts in the longitudinal direction, the vibration portion 14 vibrates in the longitudinal direction.

Figure 2:
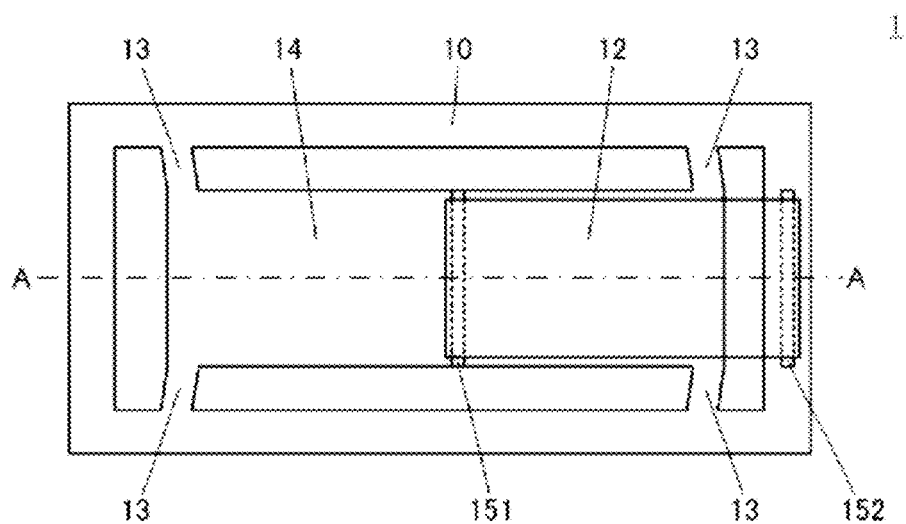
FIG. 2 is a plan view of the vibration structure 1.

The piezoelectric film 12 has a planar electrode formed on both main surfaces. A drive circuit (not shown) is connected to each electrode. The drive circuit expands and contracts the piezoelectric film 12 by applying voltage to the plane electrode. For example, in a case where the drive circuit applies a negative voltage to the piezoelectric film 12, and the piezoelectric film 12 contracts, the vibration portion 14 is displaced in a longitudinal direction (right direction in FIG. 2) as shown in FIG. 2.

Further, when the drive circuit applies a positive voltage to the piezoelectric film 12, the piezoelectric film 12 expands. However, even if the piezoelectric film 12 expands, only the piezoelectric film 12 bends, and the vibration portion 14 is hardly displaced. For this reason, the drive circuit mainly applies a negative voltage to the piezoelectric film 12 to expand and contract the piezoelectric film 12, so as to vibrate the vibration portion 14. Note that, in a case where the piezoelectric film 12 is connected while being applied with tension, the support portion 13 which has been bent by initial tension returns to an original state and the vibration portion 14 is displaced at the time the film is stretched.

The application of the voltage as described above is repeatedly performed. That is, the drive circuit applies AC voltage. A driving waveform may be any waveform such as a rectangular wave, a triangular wave, a trapezoidal wave or the like. For example, when a sine wave is applied, unnecessary vibration can be reduced, and a sound generated by the unnecessary vibration can be reduced.

Next, rotation of the vibration portion 14 will be described. Hereinafter, a description will be given of a structure in which the vibration portion 14 has a finite thickness and is connected to the piezoelectric film 12 via the first connection member 151.

Figure 3A:
FIG. 3(A) is a cross-sectional view of a case where a first connection member is disposed on an opposite side to a second connection member with respect to a center of gravity of a vibration portion.

FIG. 3(A) is a cross-sectional view in a case where the piezoelectric film 12 contracts in a state where the vibration portion 14 is horizontal (non-driven state).

Figure 3B:
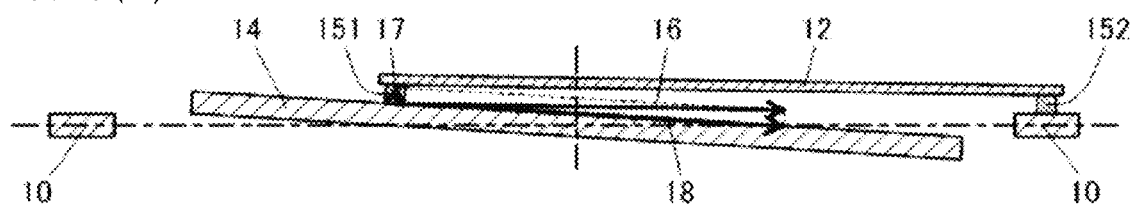
FIG. 3(B) is an exploded view of a force applied to the vibration portion when a piezoelectric film contracts from the state of FIG. 3(A).

FIG. 3(B) is a diagram showing a force 16 applied to the vibration portion 14 when the piezoelectric film 12 contracts in FIG. 3(A), and further, in FIG. 3(B), the force 16 is decomposed into a component 17 related to rotation around the center of gravity of the vibration portion 14 and a component 18 not related to rotation.

FIG. 3(B) shows that, since the vibration portion 14 has a finite thickness, the component 17 that rotates around the center of gravity of the vibration portion 14 is generated.

Figure 3C:
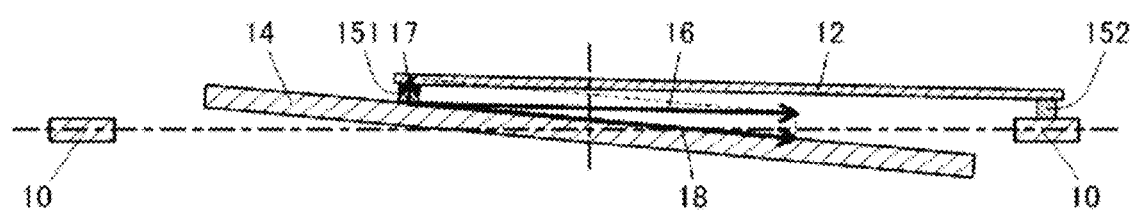
FIG. 3(C) is an exploded view of a force applied to the vibration portion when the piezoelectric film further contracts from the state of FIG. 3(B).

FIG. 3(C) shows a force applied to the vibration portion in a case where the piezoelectric film 12 further contracts from the state of FIG. 3(B).

When the piezoelectric film 12 contracts from the state of FIG. 3(B), the component 17 in a direction in which the vibration portion 14 further rotates is shown to be increased.

As the component 17 that rotates around the center of gravity of the vibration portion 14 is generated, a diaphragm starts rotating around the center of gravity when the vibration structure 1 is driven. That is, a vibration in a horizontal direction accompanied by rotation is generated.

Furthermore, a behavior in which the rotation of the vibration portion 14 is increased as the component 17 rotating around the center of gravity is increased is shown.

Figure 4A:
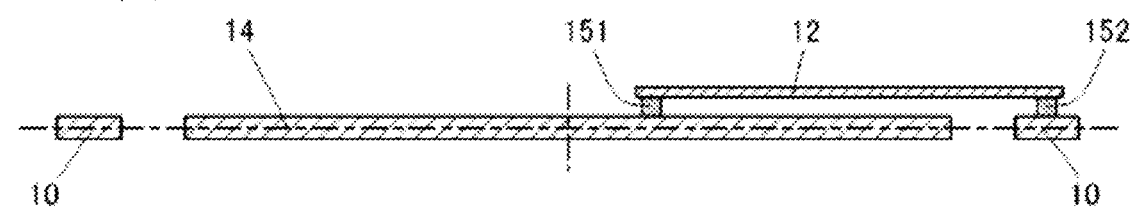
FIG. 4(A) is a cross-sectional view of the vibration structure in a case where a first connection member is disposed between the center of gravity of the vibration portion and a second connection member.
Figure 4B:
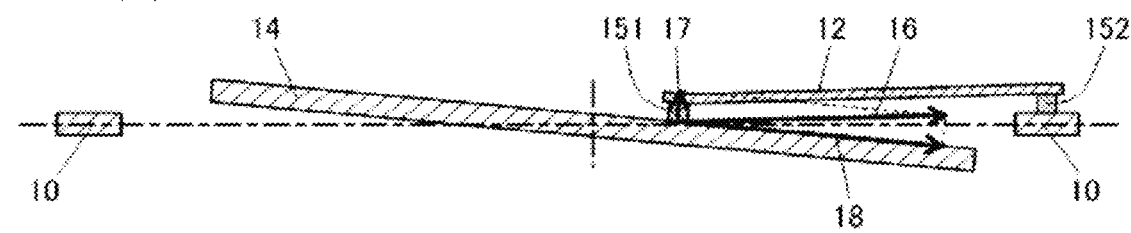
FIG. 4(B) is an exploded view of a force applied to the vibration portion when the piezoelectric film contracts from the state of FIG. 4(A).

FIG. 4(A) is a diagram of a case where the piezoelectric film 12 is connected closer to the first end side than the center of gravity of the vibration portion 14. FIG. 4(B) shows a state where the piezoelectric film 12 of FIG. 4(A) is contracted.

FIG. 4(B) is a diagram showing the force 16 applied to the vibration portion 14 when the piezoelectric film 12 contracts while the vibration portion 14 is inclined during expansion and contraction of the piezoelectric film 12 like FIG. 3(B), and further, in FIG. 4(B), the force is decomposed into the component 17 related to rotation around the center of gravity of the vibration portion 14 and the component 18 not related to rotation.

As shown in FIG. 4(B), if the piezoelectric film 12 contracts while the vibration portion 14 is inclined, the component 17 that rotates the vibration portion 14 in a direction to make the inclination horizontal is generated. For this reason, rotation of the vibration portion 14 when tilted can be suppressed.

Figure 5:
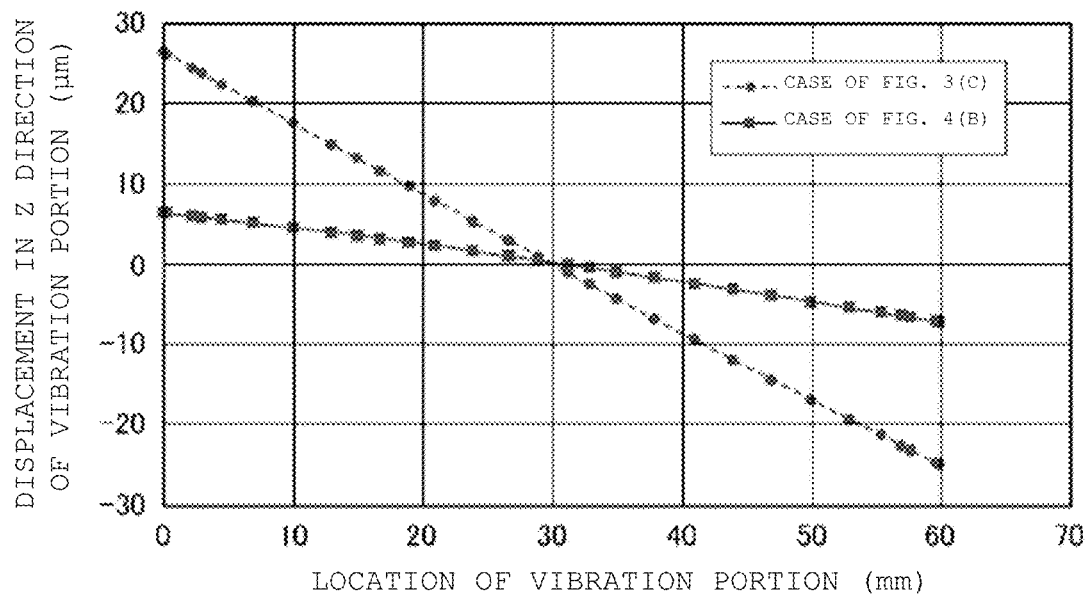
FIG. 5 is a diagram comparing displacement of the vibration portion of FIG. 3(C) with displacement of the vibration portion of FIG. 4(B).

FIG. 5 is a diagram showing displacement of the vibration portion 14. A graph plotted with a black circle in FIG. 5 represents displacement of the vibration portion 14 in a case where the piezoelectric film 12 in FIG. 3(C) is connected closer to the second end side than the center of gravity of the vibration portion 14, and a graph plotted by a black square in FIG. 5 represents displacement of the vibration portion 14 in a case where the piezoelectric film 12 in FIG. 4(B) is connected closer to the first end side than the center of gravity of the vibration portion 14.

The displacement amounts of the vibration portion 14 show that the displacement of the vibration portion 14 in the case where the piezoelectric film 12 is connected closer to the first end side than the center of gravity of the vibration portion 14 is smaller. That is, as the piezoelectric film 12 is connected closer to the first end side than the center of gravity of the vibration portion 14, rotation of the vibration portion 14 can be suppressed, and a sound generated in the vibration structure 1 can be suppressed. That is, since a restoring force by the contraction of the piezoelectric film 12 is generated with respect to the rotation of the vibration portion 14 with the center of gravity as a fulcrum, the generation of vibration in a vertical direction or accompanied by rotation can be suppressed, and the generation of a noise sound can be reduced.

FIGS. 3(C) and 4(B) show a case where, for easier understanding, an end portion of the first end side of the vibration portion 14 is displaced to the side opposite to the side where the first connection member 151 is disposed. However, the rotation of the vibration portion 14 is similarly suppressed in a case where the end portion is displaced in the opposite direction.

Further, in FIGS. 3(C) and 4(B), for easier understanding, the displacement of the vibration portion 14 is shown larger than the actual displacement. The actual displacement of the vibration portion 14 is smaller.

Figure 6A:
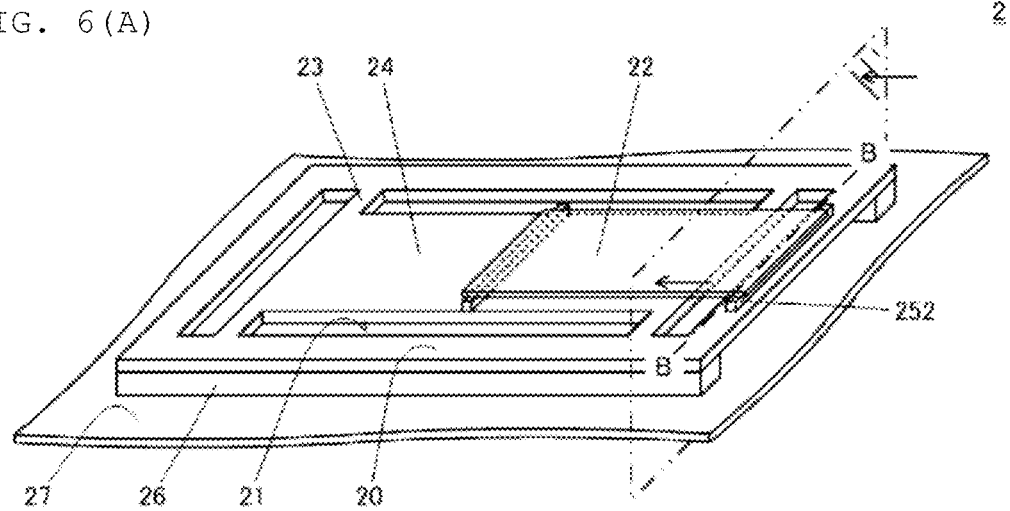
FIG. 6(A) is a perspective view of a vibration structure 2.
Figure 6B:
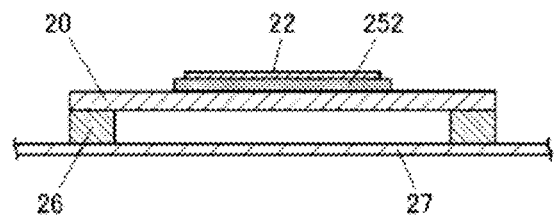
FIG. 6(B) is a cross-sectional view along B-B in FIG. 4(A).

FIG. 6(A) is a perspective view of a vibration structure 2 according to a second embodiment of the present invention. FIG. 6(B) is a cross-sectional view of the vibration structure 2 along B-B in FIG. 6(A).

FIG. 6(A) shows a structure in which the vibration structure 2 is attached to one surface of a housing 27 via a spacer 26.

The spacer 26 is attached along a long side of a frame-shaped member 20 having a rectangular shape. The spacer 26 has a thickness approximately equal to or greater than that of a vibration portion 24 and has a rectangular parallelepiped shape.

The spacer 26 provides space between the vibration structure 2 and the housing 27. When the vibration portion 24 of the vibration structure 2 rotates and an air layer between the vibration structure 2 and the housing 27 becomes sparse or dense, the spacer 26 creates an air escape path by providing a certain opening to suppress generation of a sound.

The spacer 26 is not limited to the shape shown in FIG. 6(A). The spacer 26 may be provided on a short side of the frame-shaped member 20. The spacer 26 does not have to be a rectangular parallelepiped, and may have an elliptical shape or a spherical shape.

In the vibration structure 2 described above, the vibration portion 24 vibrates in a plane direction within an opening 21 of the frame-shaped member 20. Accordingly, as shown in FIG. 4(B), the overall thickness of the vibration structure 2 is substantially the sum of a thickness of a piezoelectric film 22, a thickness of a connection member 25, and a thickness of the vibration portion 24 plate, and is extremely small. Further, the piezoelectric film 22 is elastic and has impact resistance. Furthermore, in a case where the frame-shaped member 20, the vibration portion 24, and a support portion 23 are formed of a single rectangular plate member of the same member, another member (with creep deterioration) such as rubber does not need to be used to support the vibration portion 24. Therefore, according to the structure of the vibration structure 2, stable vibration can be performed for a long time.

Note that the shape of the vibration portion 24 is not limited to the shape shown in FIG. 4(A). For example, the frame-shaped member 20 does not need to have an annular shape that surrounds the entire circumference in the plan view, and may have a partially open structure. Further, the frame-shaped member 20 and the vibration portion 24 do not need to be rectangular in the plan view. The frame-shaped member 20 and the vibration portion 24 may have a polygonal shape, a circular shape, an elliptical shape, or the like.

Figure 7A:
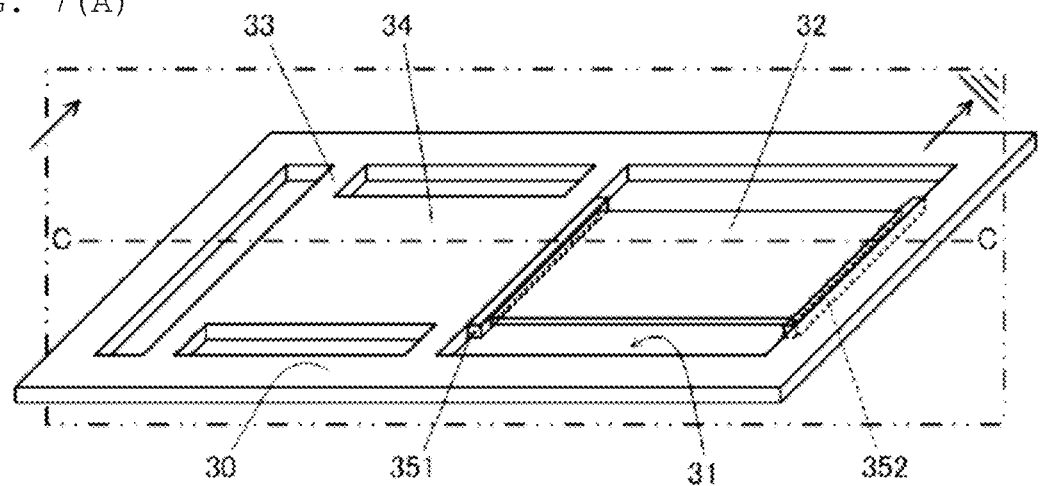
FIG. 7(A) is a perspective view of a vibration structure 3.
Figure 7B:
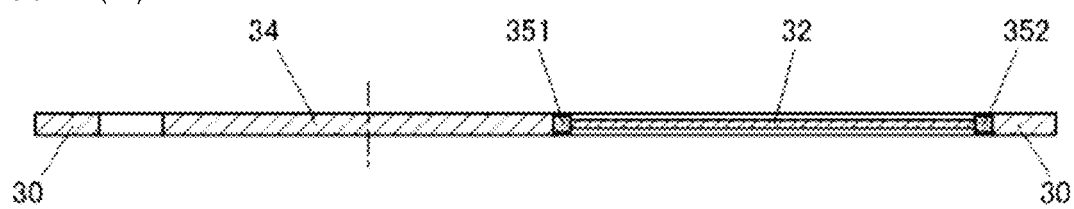
FIG. 7(B) is a cross-sectional view along C-C in FIG. 5(A).

FIG. 7(A) is a perspective view of a vibration structure 3 according to a third embodiment of the present invention. FIG. 7(B) is a cross-sectional view of the vibration structure 3 along C-C in FIG. 7(A).

In the vibration structure 3 of FIG. 7(A), a piezoelectric film 32 is connected to a first end side surface of a vibration portion 34 via the first connection member 351, and furthermore, is connected to a side surface of a frame-shaped member 30 facing the first end side surface of the vibration portion 34 via a second connection member 352.

As can be seen from FIG. 7(B), the piezoelectric film 32 is connected to a location close to a plane parallel to a main surface of the vibration portion 34 passing through the center of gravity of the vibration portion 34. For this reason, when the piezoelectric film 32 contracts, a force component that generates rotation around the center of gravity of the vibration portion 34 is less likely to be generated. Due to the above, a sound generated in the vibration structure 3 can be further suppressed.

Furthermore, since the piezoelectric film 32 is not connected to the vibration portion 34 on a main surface of the frame-shaped member 30 via a connection member 35, an entire thickness of the vibration structure 3 is not increased.

The piezoelectric film 32 may be connected to the vibration portion 34 and the frame-shaped member 30 without using the connection member 35. For example, there may be employed a structure in which the vibration portion 34 and the frame-shaped member 30 are formed by adhering thin plate-shaped members to each other, and the piezoelectric film 32 is sandwiched between them. In this case, the piezoelectric film 32 can be disposed in a location further closer to a plane parallel to the main surface of the vibration portion 34 that passes through the center of gravity of the vibration portion 34.

Figure 8A:
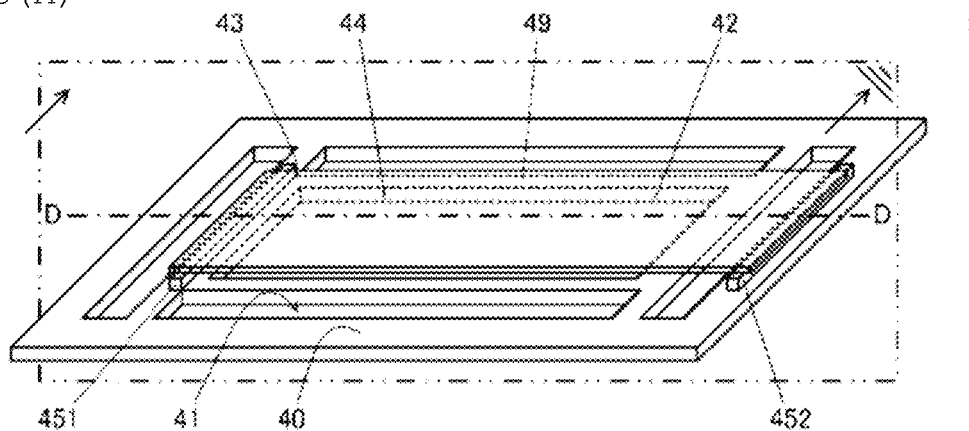
FIG. 8(A) is a perspective view of a vibration structure 4.
Figure 8B:
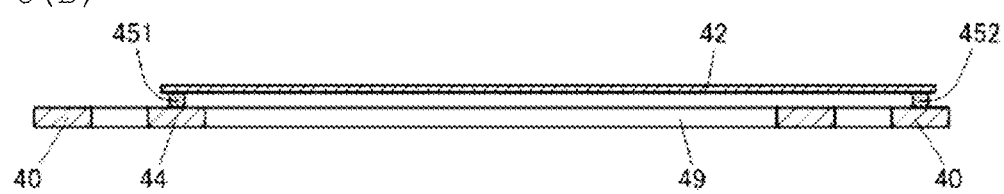
FIG. 8(B) is a cross-sectional view along D-D in FIG. 8(A).

FIG. 8(A) is a perspective view of a vibration structure 4 according to a fourth embodiment of the present invention. FIG. 8(B) is a cross-sectional view of the vibration structure 4 along D-D in FIG. 8(A).

The vibration structure 4 includes a frame-shaped member 40, an opening 41, a piezoelectric film 42, a support portion 43, a vibration portion 44, a connection member 45, and a vibration portion opening 49.

The vibration portion 44 has the vibration portion opening 49, and a shape of the vibration portion 44 is a frame shape.

The piezoelectric film 42 is connected to the frame-shaped member 40 and the vibration portion 44. A first end in a longitudinal direction of the piezoelectric film 42 is connected to a first end in a longitudinal direction of the frame-shaped member 40. A second end of the piezoelectric film 42 is connected to a second end in a longitudinal direction of the vibration portion 44.

In the vibration structure 4 having this configuration, the moment of inertia around the center of gravity of the vibration portion 44 is large as compared with a case where the vibration portion 44 is made of a uniform single plate with the same weight. For this reason, even in a case where a force for rotating around the center of gravity of the vibration portion 44 is applied due to the contraction of the piezoelectric film 42, the moment of inertia becomes large and an angular acceleration decreases, and displacement of the vibration portion 44 becomes small.

As a result, a sound generated in the vibration structure 4 can be suppressed.

Further, with this configuration, the vibration structure 4 can be lighter in weight as compared with the case where the vibration portion 44 is made from a uniform single plate having the same degree of unlikeliness to rotate.

An opening portion of the vibration portion 44 is not limited to the above shape, and may be any shape with which the moment of inertia is large as compared with a uniform single plate shape. The vibration portion opening 49 may be provided in the vibration portion 44 as a plurality of openings. Preferably, a structure having an opening at a position including the center of gravity is preferable. However, the configuration not limited to this. Furthermore, a configuration in which the vibration portion 44 has a weight disposed at a position far from the center of gravity may be employed. In that case, a similar effect to that of the vibration structure 4 can be obtained. Further, the vibration portion 44 may have density and material that are non-uniform as a single plate.

Further, similarly to the first embodiment, the configuration may be such that the first end in the longitudinal direction of the piezoelectric film 42 is connected to the first end in the longitudinal direction of the frame-shaped member 40, and the second end of the piezoelectric film 42 is connected closer to the first end side in the longitudinal direction than the center of gravity of the vibration portion 44. In this case, the structure becomes one in which less rotation occurs, and the generation of a sound can be further suppressed.

The characteristic configurations in the first to fourth embodiments of the present invention described above can be combined with each other without departing from the gist of the present invention.

The above-described embodiments disclosed this time are an example in all respects, and is not restrictive. The technical scope of the present invention is defined by the claims, and includes all modifications within the meaning and scope equivalent to the description of the claims.

DESCRIPTION OF REFERENCE SYMBOLS

1: Vibration structure
10: Frame-shaped member
11: Opening
12: Piezoelectric film
13: Support portion
14: Vibration portion
15: Connection member
151: First connection member
152: Second connection member
16: Force applied to vibration portion 14
17: Component related to rotation around center of gravity of vibration portion 14
18: Component not related to rotation
26: Spacer
27: Housing
49: Vibration portion opening

The invention claimed is:

1. A vibration structure comprising:
a film constructed to deform in a plane direction as a voltage is applied thereto;
a frame-shaped member;
a vibration portion surrounded by the frame-shaped member in a plan view of the vibration structure;
a support portion connecting the vibration portion and the frame-shaped member, and supporting the vibration portion within the frame-shaped member such that the vibration portion vibrates in the plane direction when the film is deformed in the plane direction;
a first connection member that connects the film to the vibration portion; and
a second connection member that connects the film to the frame-shaped member, wherein
the first connection member is disposed between a center of gravity of the vibration portion and the second connection member when the vibration portion is viewed in the plan view.

2. The vibration structure according to claim 1, wherein
the second connection member is disposed on a side surface of the vibration portion,
the first connection member is disposed on a side surface of the frame-shaped member facing the side surface of the vibration member, and
the film is disposed between the first connection member and the second connection member.

3. The vibration structure according to claim 1, wherein the frame-shaped member, the vibration portion, and the support portion are formed of a same material.

4. The vibration structure according to claim 1, wherein the vibration portion is a frame-shaped vibration portion.

5. The vibration structure according to claim 4, wherein the frame-shaped vibration portion has an opening at a position including the center of gravity of the frame-shaped vibration portion.

6. A vibration generator comprising:
the vibration structure according to claim 1;
a housing in which the vibration structure is disposed; and
a spacer member that provides a space between the vibration structure and the housing.

7. The vibration generator according to claim 6, wherein
the second connection member is disposed on a side surface of the vibration portion,
the first connection member is disposed on a side surface of the frame-shaped member facing the side surface of the vibration member, and
the film is disposed between the first connection member and the second connection member.

8. The vibration generator according to claim 6, wherein the frame-shaped member, the vibration portion, and the support portion are formed of a same material.

9. The vibration generator according to claim 6, wherein the vibration portion is a frame-shaped vibration portion.

10. The vibration generator according to claim 9, wherein the frame-shaped vibration portion has an opening at a position including the center of gravity of the frame-shaped vibration portion.

11. A vibration structure comprising:
a film constructed to deform in a plane direction as a voltage is applied thereto;
a frame-shaped member;
a vibration portion surrounded by the frame-shaped member in a plan view of the vibration structure;
a support portion connecting the vibration portion and the frame-shaped member, and supporting the vibration portion within the frame-shaped member such that the vibration portion vibrates in the plane direction when the film is deformed in the plane direction;
a first connection member that connects the film to the vibration portion; and
a second connection member that connects the film to the frame-shaped member.

12. The vibration structure according to claim 11, wherein
the second connection member is disposed on a side surface of the vibration portion,
the first connection member is disposed on a side surface of the frame-shaped member facing the side surface of the vibration member, and
the film is disposed between the first connection member and the second connection member.

13. The vibration structure according to claim 11, wherein the frame-shaped member, the vibration portion, and the support portion are formed of a same material.

14. The vibration structure according to claim 11, wherein the vibration portion is a frame-shaped vibration portion.

15. The vibration structure according to claim 14, wherein the frame-shaped vibration portion has an opening at a position including the center of gravity of the frame-shaped vibration portion.

16. A vibration generator comprising:
the vibration structure according to claim 11;
a housing in which the vibration structure is disposed; and
a spacer member that provides a space between the vibration structure and the housing.

17. The vibration generator according to claim 16, wherein
the second connection member is disposed on a side surface of the vibration portion,
the first connection member is disposed on a side surface of the frame-shaped member facing the side surface of the vibration member, and
the film is disposed between the first connection member and the second connection member.

18. The vibration generator according to claim 16, wherein the frame-shaped member, the vibration portion, and the support portion are formed of a same material.

19. The vibration generator according to claim 16, wherein the vibration portion is a frame-shaped vibration portion.

20. The vibration generator according to claim 19, wherein the frame-shaped vibration portion has an opening at a position including the center of gravity of the frame-shaped vibration portion.

* * * * *